United States Patent [19]

Mahmood

[11] Patent Number: 5,321,319
[45] Date of Patent: Jun. 14, 1994

[54] HIGH SPEED CMOS BUS DRIVER CIRCUIT THAT PROVIDES MINIMUM OUTPUT SIGNAL OSCILLATION

[75] Inventor: Oazi Mahmood, San Jose, Calif.

[73] Assignee: Advanced Micro Devices, Inc., Sunnyvale, Calif.

[21] Appl. No.: 895,288

[22] Filed: Jun. 8, 1992

[51] Int. Cl.[5] ............... H03K 19/003; H03K 19/0948
[52] U.S. Cl. .................................. 307/443; 307/451; 307/296.8; 307/473
[58] Field of Search ............ 307/443, 451, 473, 296.8, 307/475

[56] References Cited

U.S. PATENT DOCUMENTS

| | | | |
|---|---|---|---|
| 4,527,077 | 7/1985 | Higuchi et al. | 307/296.8 |
| 4,788,455 | 11/1988 | Mori et al. | 307/296.8 |
| 4,833,342 | 5/1989 | Kiryu et al. | 307/296.8 |
| 4,873,458 | 10/1989 | Yoshida | 307/451 |
| 4,877,980 | 10/1989 | Kubinec | 307/443 |
| 5,029,283 | 7/1991 | Ellsworth et al. | 307/443 |
| 5,109,187 | 4/1992 | Guliani | 307/296.8 |
| 5,136,182 | 8/1992 | Fawal | 307/443 |
| 5,182,468 | 1/1993 | Erdelyi et al. | 307/296.8 |

Primary Examiner—Edward P. Westin
Assistant Examiner—Jon Santamauro
Attorney, Agent, or Firm—Benman Collins & Sawyer

[57] ABSTRACT

A high speed bus driver circuit is disclosed that minimizes output signal oscillation by maintaining the clamp voltage at specified levels. The driver circuit includes a pair of voltage preference circuits that are designed to deliver the appropriate clamp voltages even at the best case speed corners, the circuit prevents simultaneous turn on of drive transistors, equalizes the propagation delay and provides for first access for tristating the bus driver transistors.

8 Claims, 6 Drawing Sheets

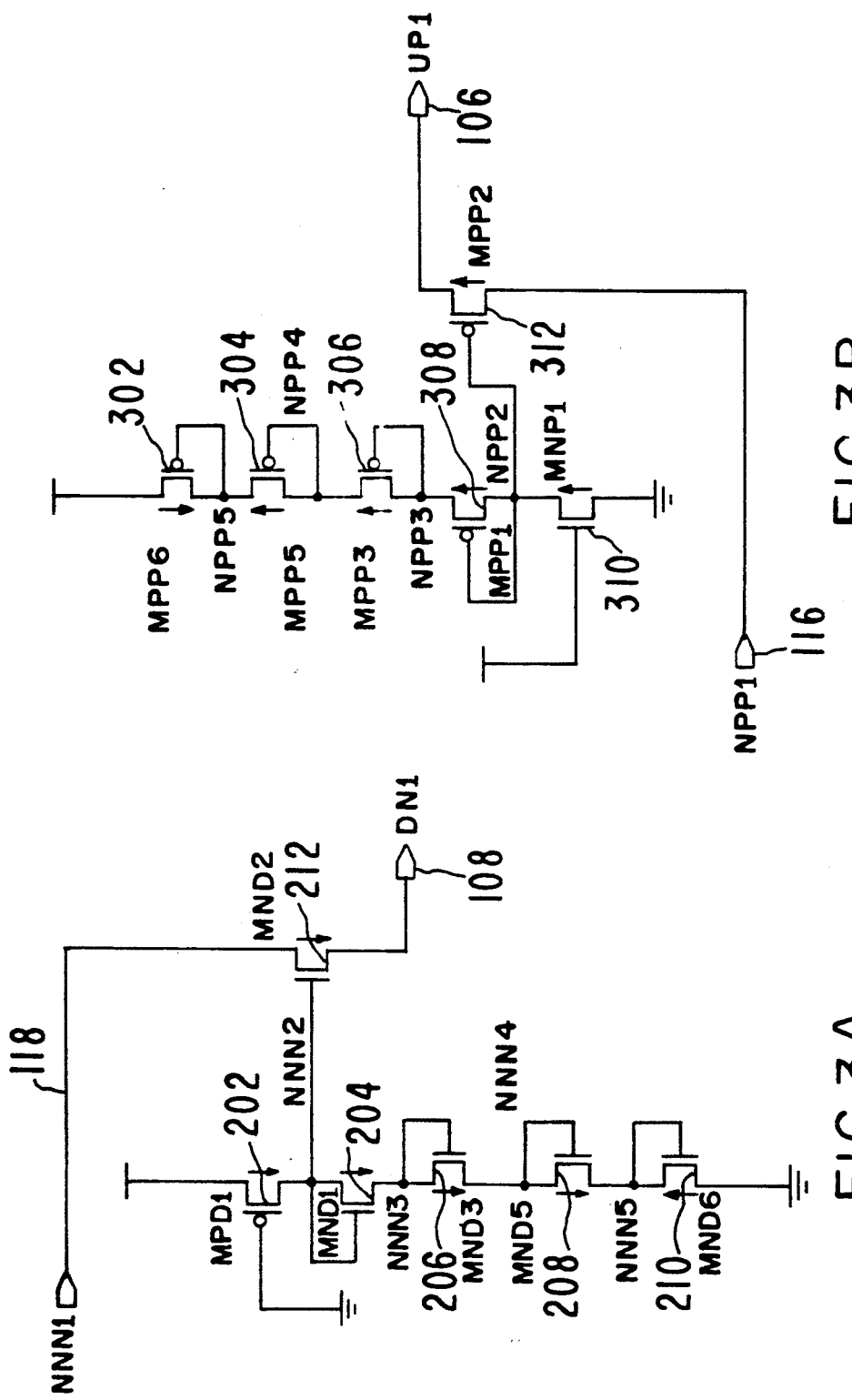

HIGH SPEED CMOS BUS DRIVER CIRCUIT THAT PROVIDES MINIMUM OUTPUT SIGNAL OSCILLATION

FIELD OF THE INVENTION

This invention relates to a driver circuit utilized to provide a voltage level to a data bus and more particularly to an improved bus driver circuit which provides better immunity to the power supply and semiconductor processing changes.

BACKGROUND OF THE INVENTION

High speed, high current bus driver circuits are utilized to rapidly charge or discharge a data bus to a high or low voltage level. Typically when this rapid charging and discharging occurs the resulting effect can often be a damped oscillation or ringing of current flowing through the driver. This ringing effect is undesirable because it can cause false information or false data to be provided to the bus.

The network formed by the bus driver, its interconnects and the load on the data bus can be represented by an RLC equivalent circuit. In this type of equivalent circuit the inductance, L, is due to the inherent parasitic self inductance of the leads connected to the driver circuit, the capacitance C is due to the capacitive load of the devices connected to the bus, and the resistance R is the resistance of the charging or discharging path.

The resistance R acts as a dissipating element in order that the oscillation of the circuit decays. The ratio of the resistance R and the critical resistance factor $2(L/C)^{\frac{1}{2}}$ determines the amount of damping the circuit will experience while dissipating its power.

This damped ringing can cause unintentional triggering of the devices connected to the data bus if the voltage amplitude of an oscillation cycle exceeds the logical threshold device of the device. Since this damped oscillation will also be present on the power supply lines of the bus driver circuit, other circuits such as the input buffer circuit sharing the same power line will likely experience voltage failures due to the distortion of the power supply voltage. Finally, a noisy power supply is likely to cause ringing on the data which has been driven to that power rail by other bus drivers sharing the power line. This ringing is likely to happen regardless of the amount of self inductance L that the other bus drivers are on their leads.

The voltage amplitude of this damped ringing is a function of the rate of change of the current (di/dt). Since the values of the parasitic physical elements L&C of the driver network are constant, their effect on the current cannot be altered. However, one possible way of controlling the rate of change of current would be to control the flow of current through the driver transistors that form a portion of the bus driver circuit. The problem with this solution is there is a trade off between propagation delay which slows the bus driver circuit down and the clamping voltage or the amplitude of the signals that are provided to the gates of the transistors.

A circuit addressing this problem is described in U.S. Pat. No. 4,877,980, entitled, "Time Variant Drive Circuit For High Speed Bus Driver To Limit Oscillation Or Ringing On A Bus," and assigned to the assignee of this patent application. In this patent a bias voltage ($V_{bias}$) is applied to one of gate of a p channel and n channel transistor pair. In this patent the bias voltage is chosen to prevent ringing on the bus.

Although the invention described in this patent works satisfactorily for its intended purposes, it does not disclose a means for providing the $V_{bias}$ voltage. Accordingly, what is needed is a circuit for providing a voltage to the driver transistors of a driver circuit that is flexible and is simple to implement. What is also needed, is a bus driver circuit which minimizes the damped ringing or oscillation problem associated with previously known bus driver circuits at the same time it is not appreciably effected by the propagation delays that can be generated when regulating the rate of change of the current.

The present invention provides a bus driver circuit which controls the amplitude and slew rate of the gate voltages of the driver transistors while providing better immunity to power supply changes and process variations that are inherent in the semiconductor device.

SUMMARY OF THE INVENTION

A bus driver circuit is disclosed that minimizes signal oscillation on the data bus while at the same time minimizing the propagation delay of the circuit. The driver circuit comprises first and second reference voltage generators. The reference generators are coupled to a pair of drive transistors. The reference generators are p-type and n-type devices respectively.

The reference generators have two functions. First they provide clamping voltages to the gates of the driving transistors. The generators also provide propagation delay for driving up and down signals respectively. It is known that at lower voltage levels (3–5 volts) if the level of clamp voltages at gates of the driver transistor have been closer to be vcc-minus 2 to 4 times the value of the p channel and vss plus 2–4 times the n channel threshold the amplitude of the output oscillation and the total propagation delay are at a minimum.

The bus driver of the present invention comprises first and second voltage generator means, and first and second drive transistors. The one of the generator means comprises an n-type generator circuit and the other of the generator means comprises a p-type generator circuit. Each of the generator means circuits provides clamp voltages to the gate of its respective drive transistor.

Each of the generator means includes a plurality of saturated transistors connected in series in which the gate of each transistor in the plurality is at a voltage threshold level higher than its source voltage. Each of the plurality of transistors provides a clamping voltage to one of the drive transistors. One of the plurality of transistors provides a clamp voltage that is a multiple of the threshold voltage above the ground potential. The other of the plurality of transistor providing a clamp voltage that is a multiple of the voltage threshold below a power supply voltage.

In doing so, a high speed bus driver circuit is provided that has significant advantages over previously known circuits. In addition through this design the ringing associated with such circuits is effectively minimized.

The present invention through the use of a pair of reference voltage generators and maintaining the clamping voltage at a certain threshold levels effectively minimizes ringing and therefore prevents the unintentional triggering of devices that are located on a data bus. In addition, it also reduces the propagation delay, thereby allowing the bus driver to operate at optimum speeds with minimum delays.

BRIEF DESCRIPTION OF THE DRAWINGS

FIG. 3(a) shows a first embodiment of a n-type reference generator circuit in accordance with the present invention.

FIG. 3(b) shows a first embodiment of a p-type reference generator circuit in accordance with the present invention.

DETAILED DESCRIPTION OF THE INVENTION

The present invention relates to an improvement in bus driver circuit technology. The following description is presented to enable one of ordinary skill in the art to make and use the invention and is provided in the context of a patent application and its requirements. Various modifications to the preferred embodiments will be readily apparent to those skilled in the art and the generic principles defined herein may be applied to other embodiments. Thus, the present invention is not intended to be limited to the embodiments shown, but is to be accorded the widest scope consistent with the principles and features described herein.

Figure 1:
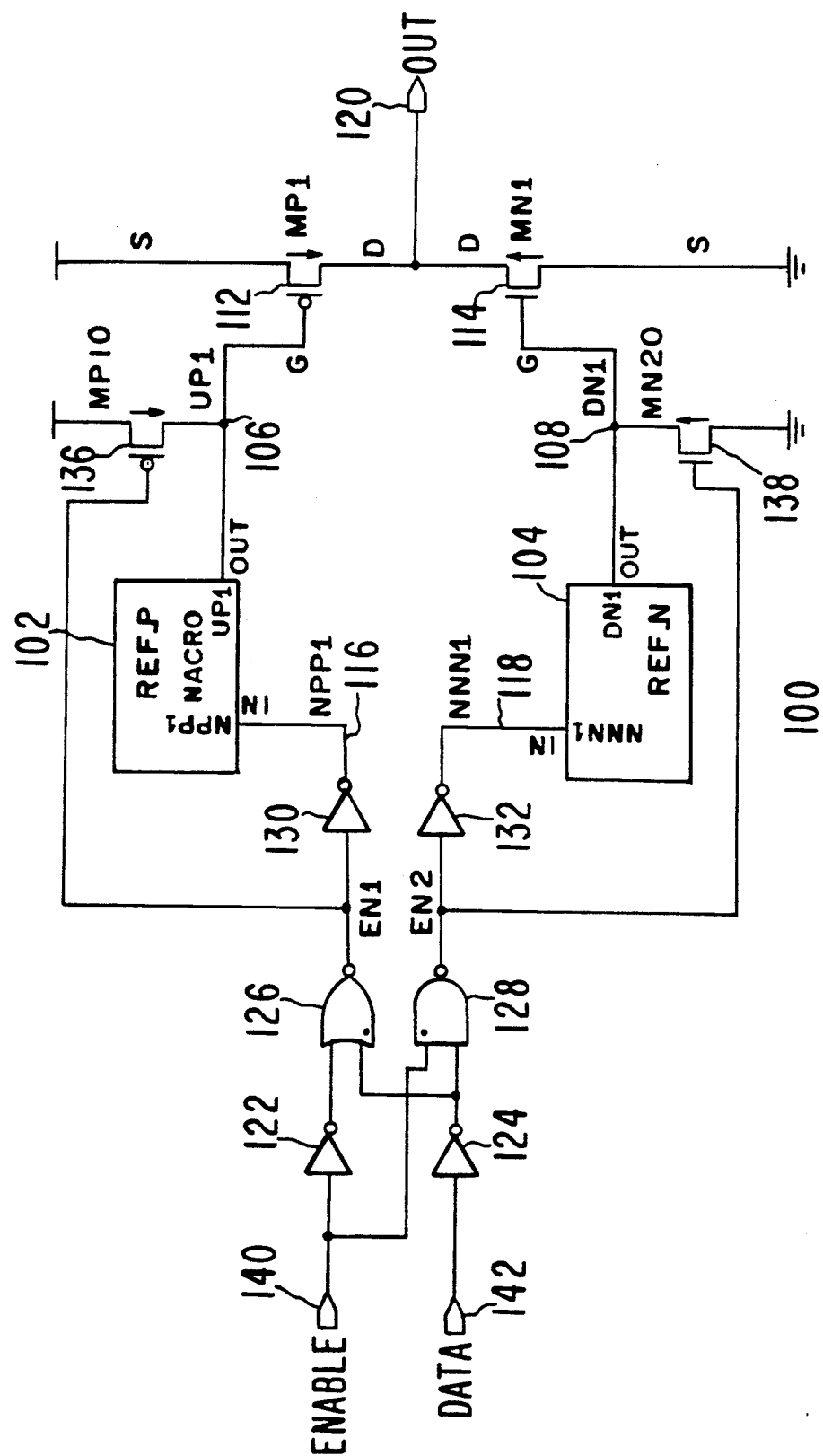
FIG. 1 shows in block diagram form a bus driver circuit in accordance with the present invention.

A block diagram representative of bus driver circuit 100 in accordance with the invention is shown in FIG. 1. The bus driver circuit 100 of FIG. 1 includes an enable input 140 and a data input 142. The inputs of inverters 122 and 124 are coupled to enable input 140 and data input 142 respectively.

The output of inverter 122 is coupled to input of a two input NOR gate 126. The output of inverter 124 is coupled to a second input of the NOR gate 126. The output of inverter 124 is also coupled to an input of two input NAND gate 128. The enable input 140 is coupled to the second input of NAND gate 128.

The outputs of NAND gate 128 is coupled to the input of inverter 132 and the gate of n-mos transistor 138. The output of inverter 132 is coupled to an input of voltage reference generator 138. The output voltage reference generator 104 is coupled to the drain of n-mos transistor 138. The source of transistor 138 is coupled to ground. The drain of n-mos transistor 138 is coupled to the gate of n-mos transistor 114. The drain of transistor 114 is coupled to the output 120 of the driver circuit.

The output of NOR gate 126 is coupled to the input of an inverter 130 and the gate of p-mos transistor 136. The output of the inverter 130 is coupled to an input of voltage reference generator. The output voltage reference generator 102 is coupled to the drain of transistor 136. The source of transistor 136 is coupled to vcc. The drain of transistor 136 is coupled to the gate of p-mos transistor 112.

The drain of transistor 112 is coupled to the output 120 of the driver circuit 100. The source of transistor 112 is coupled to vcc. The key elements of the bus driver circuit 100 are the two reference voltage generators 102 and 104. Voltage reference generator 102 for p channel circuits and voltage reference generator 104 is for n channel circuit. These voltage reference generators 102 and 104 perform two functions.

First, they provide a voltage clamp on the nodes upl 106 and dnl 108 which drive the gates of the p-mos driver transistor 112 and n-mos driver transistor 114 respectively. Secondly, these voltage reference generators 102 and 104 also provide some propagation delay for signals 116 and 118 when they drive signals upl 106 and dnl 108 respectively.

The propagation delay is present only during the period when the transistors mpl 112 or mnl 114 is being turned on. The purpose of the propagation delay is to prevent the transistors mpl 112 and mnl 114 from turning on simultaneously when the output 120 of the bus driver circuit 100 switches from one level to another.

The clamp voltage at nodes upl 106 and dnl 108 have been chosen, as described below, to be approximately vcc minus 3 times the threshold voltage value ($V_T$) of the p channel device and vss plus 3 times the threshold value ($V_T$) of the n channel respectively. What is meant by threshold voltage value ($V_T$) in the context of this patent application is the voltage required to cause the transistor to turn on.

It is known that by selecting a clamp voltage which is between 2 times and 4 times the threshold value of the transistor both the amplitude of the output oscillation and the total propagation delay through the bus driver circuit are minimized. It is also known that in low voltage applications (3-5 volts) by setting the clamp voltage value at 2-4 times the threshold value of the transistor the tradeoff between propagation delay and ringing can be optimized.

Figure 2A:
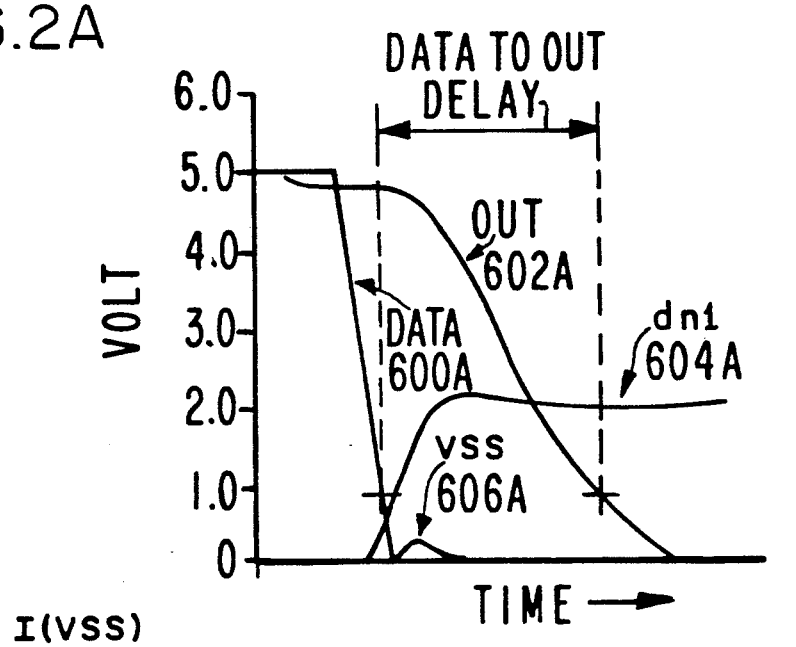
FIGS 2(a)-2(c) the effect of ringing or signal oscillation at different clamp voltage levels.
Figure 2A:
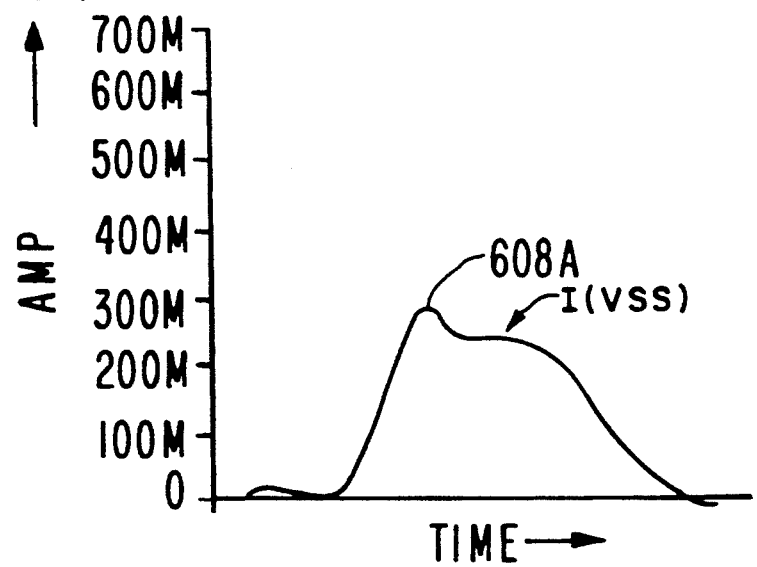
Figure 2B:
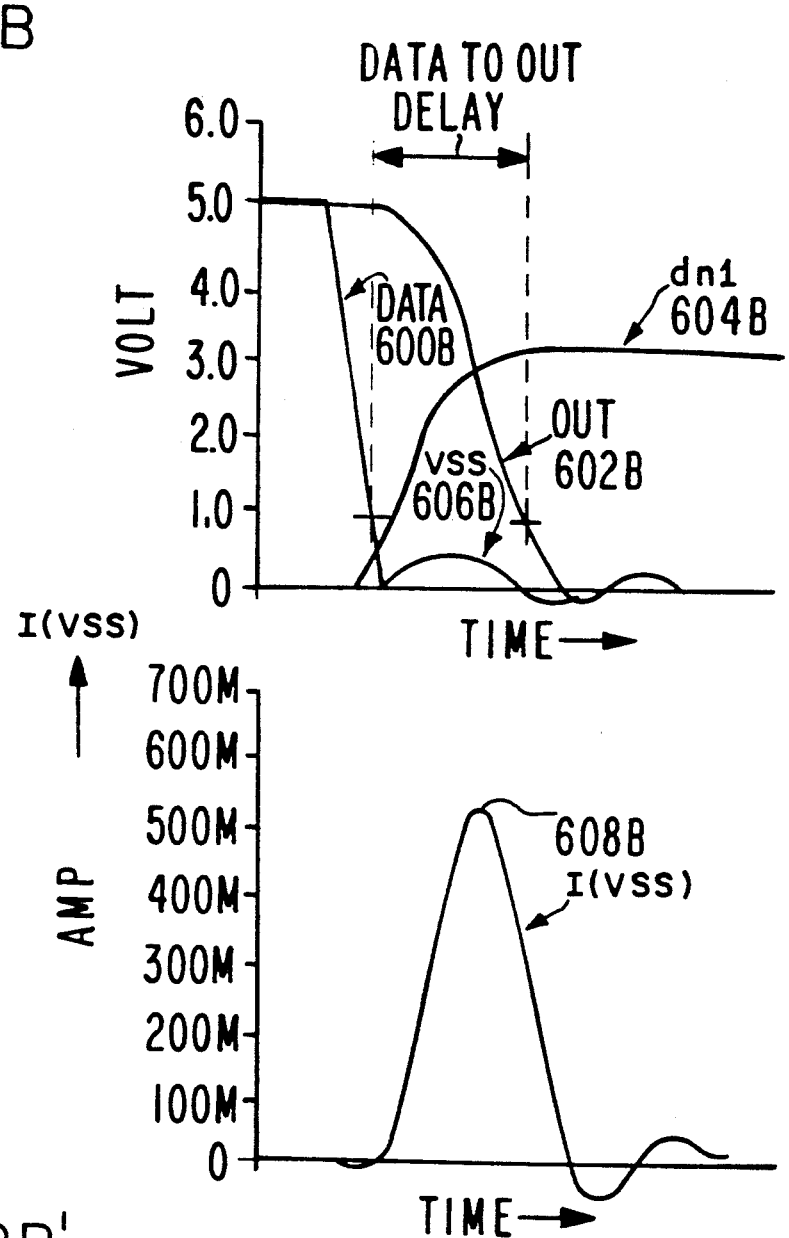
Figure 2C:
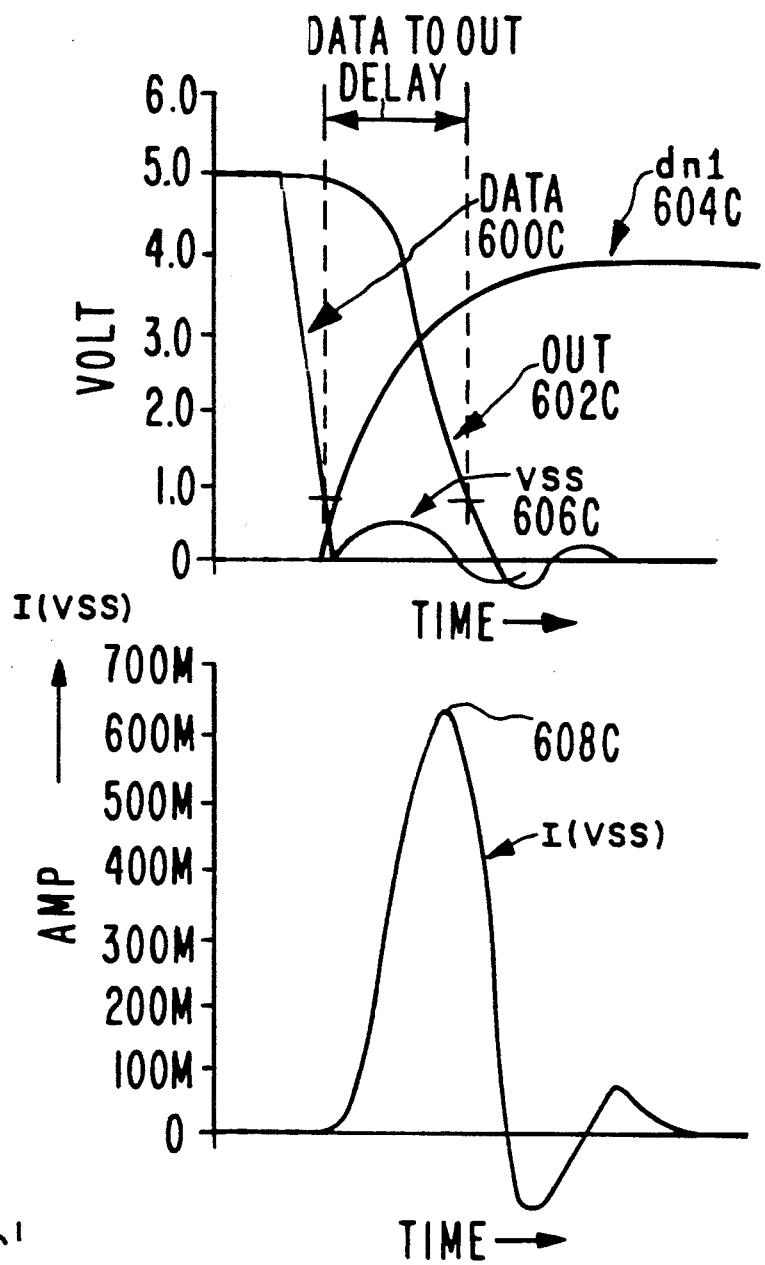

Referring now to FIG. 2(A) through 2(C) what is shown is a diagram which is illustrative of the voltage and current transient analysis for a driver circuit in which the clamp voltage is $2V_T$, $3V_T$ and $4V_T$ respectively. The following discussion would be relative to an n-type voltage generator but it will be well recognized by one of ordinary skill in the art that the generator can be a p-type generator and the diagrams will be complementary in nature.

For review purposes, the curves marked 600a through 600c are the data into circuit 100 for $2V_T$ voltage generator, $3V_T$ voltage generator, and $4V_T$ voltage generator respectively. The curves 602a through 602c are the output from the circuits from the same respective clamp voltages.

The curves 604a through 604c are the voltages at node dnl of the circuit 104 at the same clamp voltages as mentioned above. Finally, the curves 606a through 606c are the ringing voltages that are present on the vss line at the above mentioned clamp voltages. The curves 608a through 608c are the ringing current produced at the vss voltage level at the respective clamp voltages mentioned above.

What is seen as the response time as indicated by the output curves 600a through 600c that the response time for the $4V_T$ voltage generator is much faster than that for the $2V_T$ voltage generator. However, it is also seen that the voltage ringing represented by vss 606b is much higher for the $4V_T$ voltage generator than for the $2V_T$ voltage generator (606A). It is also very clear that the current ringing (608C) using a $4V_T$ reference voltage generator is much higher than the $2V_T$ voltage generator (608A). Hence, as is seen, the $3V_T$ voltage generator response time (602B) is much better than the $2V_T$ voltage generator (602A) and at the same time the ringing (606B) is somewhat less than that shown at the 4V$_T$ voltage generator. Therefore, generally the best comprise is to provide the 3V$_T$ voltage generator. However, if there is no concern about ringing, the 4V$_T$ voltage generator can be utilized.

Conversely, if a drive circuit is desired that is relatively immune to signal oscillation, a 2V$_T$ reference generator would be utilized. Therefore, for example, a lower clamp voltage at node dnl 108 will reduce the oscillation amplitude, but the delay through the bus driver circuit 100 will be longer. Similarly, a higher value of clamp voltage on that node upl 106 will reduce the delay through the bus driver circuit 100, but it will increase the amplitude of the oscillation.

The slew rate of dnl 108 is the inverter 132 and pass transistor mnd2 (212 or 412) (FIG. 3a and FIG. 4a) are sized to provide the desired slew rate on node dnl. The inverter 130 and pass transistor (312 and 512) are sized to provide the desired slew rate on node upl.

The basic schematics of the ref_n and ref_p generator circuits 104 and 102 are shown in FIG. 3(a) and FIG. 3(b) respectively. Voltage reference generator circuit 104 mostly employ n-type transistors. The voltage reference generator circuit 104 includes the nnnl input 118 coupled to the drain of n-mos transistor mnd2 212. The source of transistor 212 is coupled to the dnl 108 signal.

The gate of transistor 212 is coupled to the gate of mndl n-mos transistor 204 and the drain of mpdl p-mos transistor 202. The source of transistor 202 is coupled to vcc and the gate of transistor 202 is coupled to vss. The gate of transistor 204 is coupled to its drain and the source of transistor 204 is coupled to the drain of mnd3 n-mos transistor 206.

The drain of transistor 206 is coupled to its gate and the source of transistor 206 is coupled to the drain of mnd5, n-mos transistor 208. The source of transistor 208 is coupled so its gate and the drain of transistor 208 is coupled to the drain of nmd6 n-mos transistor 210. The gate of transistor 210 is coupled to its drain and the source of transistor 210 is coupled to ground.

Voltage reference generator circuit 104 employs mostly p-type transistors. The voltage reference generator circuit 104 includes the nppl input 116 coupled to the drain of mpp2 p-mos transistor 312 and the source of transistor 312 is coupled to the upl signal 106. The gate of n-mos transistor 312 is coupled to the gate and drain of mppl p-mos transistor 308 and the source of transistor mnpl n-mos transistor 310. The gate of transistor 310 is coupled to vcc. The source of p-mos transistor 308 is coupled to the drain of mpp3 p-mos transistor 306.

The drain of transistor 306 is coupled to its gate and the source of transistor 306 is coupled to the drain of mpp5 p-mos transistor 304. The drain of transistor 304 is coupled to its gate and the source of transistor 304 is coupled to the source of mpp6 p-mos transistor 302. The source of transistor 302 is coupled to its gate and the drain is coupled to vcc.

Reference voltage generator circuits 102 and 104 are in essence a pair of voltage divider circuits designed to deliver clamp voltages of approximately 3 volts above the vss (ground) level at node dnl and approximately 3 volts below vcc (power supply) level at node upl. The load transistors mpdl 202 of the reference voltage generator 102 and mnpl 302 of the reference voltage generator 104 are weak devices.

In FIG. 3(a) the sizes of the saturated series driver transistors, 204, 206, 208, and 210 are ratioed such that nodes nnn2, nnn3, nnn4 and nnn5 are each at approximately a V$_T$-n level higher than its source voltage. Thus the resultant clamp voltage obtained at the output of this reference circuit (node dnl) is about 3 V$_T$-n above ground. By applying the same design technique, the clamp voltage obtained at node upl of the circuit of FIG. 3(b) is about 3 V$_T$-p below vcc.

The schematics in FIG. 3(a) and FIG. 3(b) can be modified to produce a clamp voltage which is 2 or 4 times that of the threshold. If one of the saturated driver transistors is replaced by a shorting net, the clamp voltage value can be made as 2 times the value of the threshold which is approximately 2 volts. Similarly, by adding an additional saturated driver transistor into the chain of driver transistors, the level of the clamp voltage can be raised to 4 times of the threshold value.

The size of the transistor 212 (FIG. 3(a)) and the inverter 132 driving the node nnnl 118 (FIG. 1) determines the slew rate of node dnl 108. Similarly, the size of the transistor 312 (FIG. 3(b)) and the inverter 130 driving the node nppl 116 (FIG. 1) determines the slew rate of node upl.

Since the value of the transistor threshold decreases at the best case speed process corner, the advantage of these reference generator circuits is that the level of the clamp voltage also decreases at best case speed corner. As a result, the lower clamp voltage helps in controlling the current flow through the bus driver transistors mnl 114 and mpl 112 at the best case process corner. Consequently, the output oscillation is minimized even at the best case process speed corner. This provides for a more stable circuit performance.

The bus driver circuit 100 in FIG. 1 provides the same amount of propagation delay for both the "data to out" and "enable to out" access paths. It also provides fast access for tri-stating the bus driver transistors mnl 112 and mpl 114 when signal "enable" is pulled low. As mentioned above, the bus driver circuit 100 prevents simultaneous turn on of the large bus driver transistors 114 and 112.

Figures 4A, 4B:
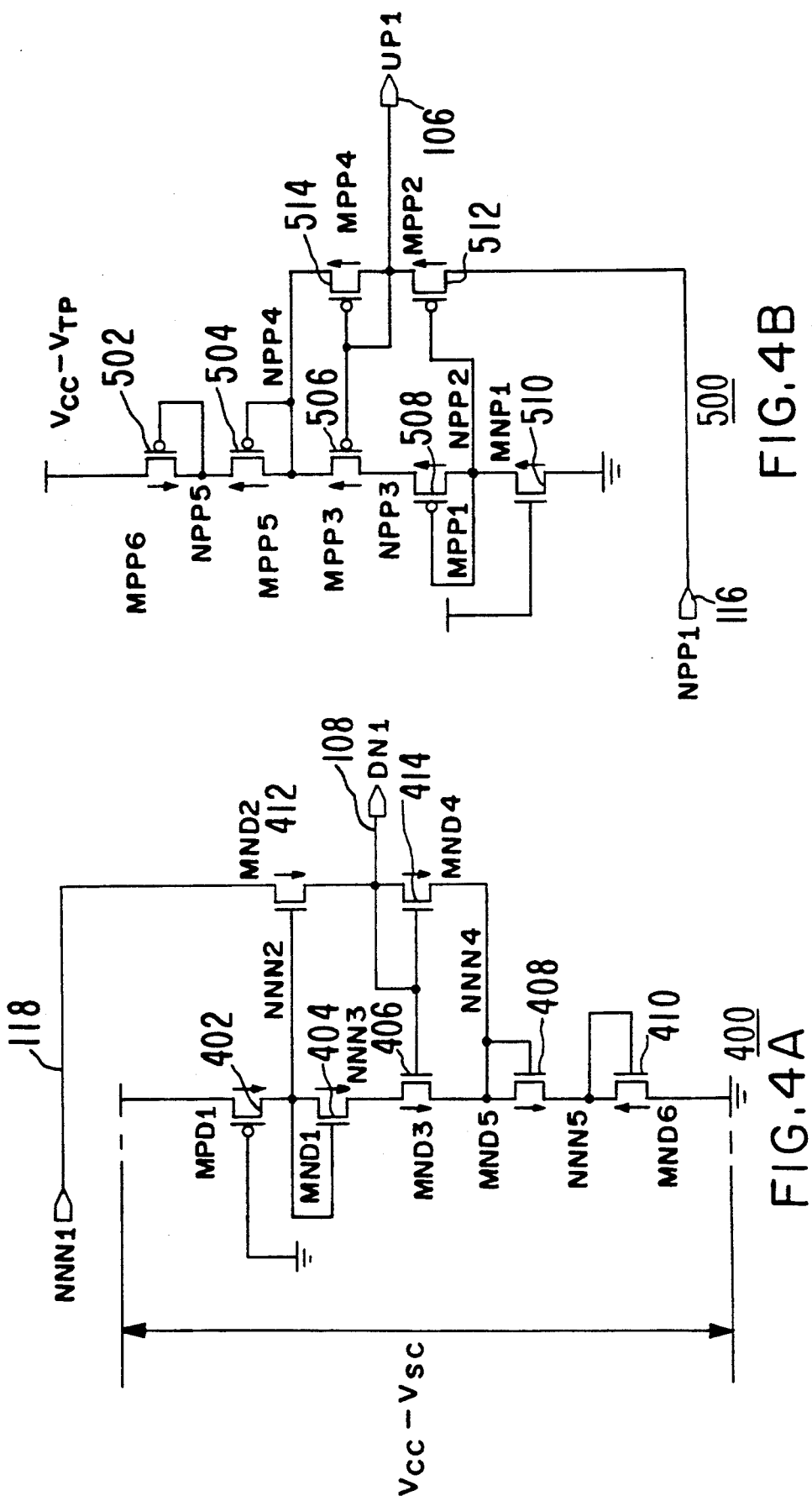
FIG. 4(a) shows a second improved embodiment of a n-type reference voltage generator circuit in accordance with the present invention.
FIG. 4(b) shows a second improved embodiment of a p-type reference voltage generator circuit.

In FIG. 4(a) and FIG. 4(b), two reference voltage generator circuits 400 and 500 are shown which provide some improvements over the circuits given in FIG. 3(a) and FIG. 3(b). The reference generator 400 of FIG. 4(a) is substantially the same as shown is FIG. 3(a) except a saturated n-mos mmd4 transistor. 414 has been added to the ref_n circuit 200 of FIG. 3(a) converting that into circuit 400, a current mirror configuration. The circuit 400 has been modified such that the gate of transistor 406 has been disconnected from its drain and has been connected directly to the gate of transistor 414. The gate and drain of transistor 414 are connected to dnl 108. The source of transistor 414 is coupled to the source of transistor 408.

Similarly, in FIG. 4(b) a saturated p-mos mpp4 514 transistor is added to the ref_p circuit of FIG. 3(b) and the circuit 500 now resembles a current mirror circuit, as well. This new configuration of the reference voltage generators 400 and 500 helps in two ways.

First, it provides large current gain in driving the loads of the large bus driver transistors 114 and 112 (FIG. 1), when node nnnl begins to rise and node nppl begins to fall. Secondly, when node nnnl is low, node dnl is also pulled low. This action shuts transistor 406 off and the ref_n generator 400 does not draw any dc current.

Similarly, a high level on node nppl cuts off transistor 506 in ref_p generator and the generator 500 stops drawing any dc current, as well. Therefore, there is no dc current drawn by these reference generators 400 and 500 when they do not drive the bus driver transistors 112 and 114. However, a small amount of dc current is drawn when upl 106 and dnl 108 are driving the driver transistors mnl 112 and mpl 114. This current is limited by constant current saturated transistors 410 (FIG. 4(a)) and 502 (FIG. 4(b)), which are weakly turned on by having their gates at just about a threshold above their sources.

Similar to the circuits given in FIG. 3(a) and FIG. 3(b), these reference voltage generators 400 and 500 are also designed to have the gates of the saturated driver transistors at a threshold above their source voltage values. Thus, the desired 3 $V_T$ reference voltage levels at nodes upl 106 and dnl 108 can be easily obtained. By removing transistors mnd6 410 (node nnn5 tied to vss) and mpp6 502 (node npp5 tied to vcc), both these generators can be made to produce a reference voltage of 2 $V_T$. Similarly, it is recognized that an additional saturated n-mos transistor between mnd5 408 and mnd6 410 and a saturated p-mos transistor between transistors mpp5 504 and mpp6 502 will transform both these generators of FIG. 4(a) and FIG. 4(b) into 4 $V_T$ generators. As mentioned before, the level of the reference voltage provides the trade off between the driver delay and the oscillation.

When transistor 406 of FIG. 4(a) is cut off (dnl 108 pulled low by nnnl 118), the node nnn2 rises to vcc. The node nnn3 which is the source of the saturated n channel transistor 404, reaches a voltage of vcc minus $V_T$-n. Under these conditions the generator does not draw any power. When node nnnl starts rising, it pulls node dnl 108 by the source following action.

As dnl 108 rises, transistor 406 turns on. This action starts pulling node nnn2 down until it reaches the 4 $V_{TN}$ level. The rising node dnl 108 and falling node nnn3, both become clamped at the 3 $V_T$ voltage levels. At this point all transistors except the p channel load transistor 402 are in saturation. The amount of power drawn through this load 402 can be very small, since a very weak transistor can be used here.

The total dc current drawn by the generator circuits 400 is the sum of the current drawn through the transistors 402 and 412. It is, however, limited by the transistor 410 (constant current source) which is weakly turned on by having both its drain and gate at about 1 $V_T$-n above the ground level.

The schematic of ref_p voltage generator circuit 500 (FIG. 3(b)) is complementary in nature to the ref_n generator circuit 400. Its transistor sizes have been ratioed to provide 4, 3, 2, and 1 $V_T$-p below the level of vcc at nodes npp2, npp3, npp4 and npp5, respectively. It operates as follows.

When node nppl is high, upl 106 is pulled high which cuts off transistor 506. The node npp2 drops to vss (or ground) and drives the transistor 512 into its linear region. The node npp3 which is the source of the saturated p channel transistor 508, reaches a voltage of vss plus $V_T$. At this time the generator 500 does not draw any power.

When node nppl starts falling, it pulls node upl 106 down by the source following action. As upl 106 falls, transistor 506 turns on and all the transistors in that current path are also on. This action starts pulling node npp2 up to the vcc minus 4 $V_T$ level. The falling node upl 106 and rising node npp3 become clamped to the vcc minus 3 $V_T$ voltage level.

At this point all transistors except the n channel transistor 510 are in saturation. The amount of power drawn through this circuit can be very small, since a very weak n channel load transistor 510 has been used. The total current flowing through this reference circuit is limited by the constant current source 502 which is weakly turned on by having its drain and gate at about 1 $V_T$-p level.

One benefit of reference voltage generators 400 and 500 is that their clamp voltages are less susceptible to the power supply variations. Since the transistor thresholds decrease at the best case speed process corner, another advantage is that the voltage on node 108 in relationship to the ground decreases in value from its best case speed process corner value. Similarly, the voltage on node upl 106 in relationship to vcc decreases at best case speed corner as well. Having lower gate drive voltage on the driver transistors mpl 112 and mpl 114, the oscillation on the output node is minimized even at best case speed process corner.

Although the present invention has been described in accordance with the embodiment shown in the FIGS., one of ordinary skill in the art recognizes that there could be variations to the embodiment and those variations would be within the spirit and scope of the present invention. Accordingly, many modifications may be made by one of ordinary skill without departing from the spirit and scope of the present invention, the scope of which is defined solely by the appended claims.

I claim:

1. A high speed bus driver comprising:

first and second transistors for providing drive potential to a bus; the first transistor providing a pull-up drive potential to the bus when the first transistor is active and the second transistor providing a pull-down drive to the bus, when the second transistor is active, when one transistor of the first and second transistor is active the other transistor is purposely made inactive, and first and second reference voltage generator circuits for providing first and second clamp voltages to the first and second transistors, one of the reference voltage generator circuits employing primarily p-mos transistors; the other of the reference voltage generator circuits employing primarily n-mos transistors, each of the reference voltage generators including a plurality of transistors connected in series such that each gate of the transistors in each plurality is at a voltage threshold level higher than its source voltage, one plurality of transistors provides a clamping voltage to one of the first and second transistors that is a multiple of the voltage threshold of said one of the first and second transistors above a ground potential, the other plurality of transistors providing a clamping voltage to the other of the first and second transistors that is a multiple of the voltage threshold of the other of the first and second transistors below a power supply voltage; each of the first and second reference voltage generators being coupled in a current mirror configuration for cutting off the dc current drawn by the reference generator when its associated one of said first and second transistors is inactive.

2. The high speed bus driver of claim 1 in which the first transistor comprises an n-mos device and the second transistor comprises a p-mos device.

3. The high speed bus driver circuit of claim 2 in which the plurality of transistors of said one of the reference voltage generator circuits provides the first clamp voltage which is three times the voltage threshold above the ground potential.

4. The high speed bus driver circuit of claim 2 in which the plurality of transistors of the other of reference voltage generator circuits provide the second clamp voltage which is three times the voltage threshold below the power supply voltage.

5. The high speed bus driver circuit of claim 2 in which the plurality of transistors of said one of the reference voltage generator circuits provides the first clamp voltage which is two times the voltage threshold above the ground potential.

6. The high speed bus driver circuit of claim 2 in which the plurality of transistors of the other of reference voltage generator circuits provide the first clamp voltage which is two times the voltage threshold below the power supply voltage.

7. The high speed bus driver circuit of claim 2 in which the plurality of transistors of said one of the reference voltage generator circuits provides a clamping voltage which is four times the voltage threshold above the ground potential.

8. The high speed bus driver circuit of claim 2 in which the plurality of transistors of the other of reference voltage generator circuits provide a clamping voltage which is four times the voltage threshold below the power supply voltage.

* * * * *

UNITED STATES PATENT AND TRADEMARK OFFICE
CERTIFICATE OF CORRECTION

PATENT NO. : 5,321,319

DATED : June 14, 1994

INVENTOR(S) :

Mahmood

It is certified that error appears in the above-identified patent and that said Letters Patent is hereby corrected as shown below:

ON THE TITLE PAGE
Item [75], Inventor: should read --Qazi Mahmood--.

Signed and Sealed this

Twelfth Day of May, 1998

Attest:

BRUCE LEHMAN

Attesting Officer

Commissioner of Patents and Trademarks